United States Patent [19]

Schmidt

[11] Patent Number: 4,731,540

[45] Date of Patent: Mar. 15, 1988

[54] ION BEAM MATERIALS PROCESSING SYSTEM WITH NEUTRALIZATION MEANS AND METHOD

[75] Inventor: Guenther Schmidt, Freising, Fed. Rep. of Germany

[73] Assignee: Siemens Aktiengesellschaft, Berlin and Munich, Fed. Rep. of Germany

[21] Appl. No.: 844,303

[22] Filed: Mar. 26, 1986

[30] Foreign Application Priority Data

Mar. 27, 1985 [DE] Fed. Rep. of Germany ....... 3511141

[51] Int. Cl.$^4$ .............................................. H01J 37/30
[52] U.S. Cl. ............................... 250/492.2; 204/192.1
[58] Field of Search ................. 250/492.21; 204/192.1

[56] References Cited

U.S. PATENT DOCUMENTS 4,278,890 7/1981 Gruen et al. ................... 250/492.21
4,351,712 9/1982 Cuomo et al. .
4,399,016 8/1983 Tsukada et al. .

FOREIGN PATENT DOCUMENTS 146625 6/1983 German Democratic Rep. .

OTHER PUBLICATIONS

L. D. Bollinger, "Ion Beam Etching with Reactive Gases", Jan. 1983, *Solid State Technology*, 99–105.
R. A. Powell et al. "Dry Etching for Microelectronics", Verlag, North Holland, *Physics Publishing* (1984), pp. 120 and 137.
R. Powell et al., "Reactive Ion Beam Etching", Dry Etching for Microelectronics, North-Holland Phys. Publ., 1984, pp. 118–129, 136–137, 182–191.

*Primary Examiner*—Craig E. Church
*Assistant Examiner*—Jack I. Berman
*Attorney, Agent, or Firm*—Hill, Van Santen, Steadman & Simpson

[57] ABSTRACT

An ion beam processing system for etching or sputtering includes a voltage source for applying an extraction voltage between a beam neutralizing filament and a specimen mount target for improved ion beam neutralization efficiency and reduced contamination.

17 Claims, 1 Drawing Figure

U.S. Patent   Mar. 15, 1988   4,731,540
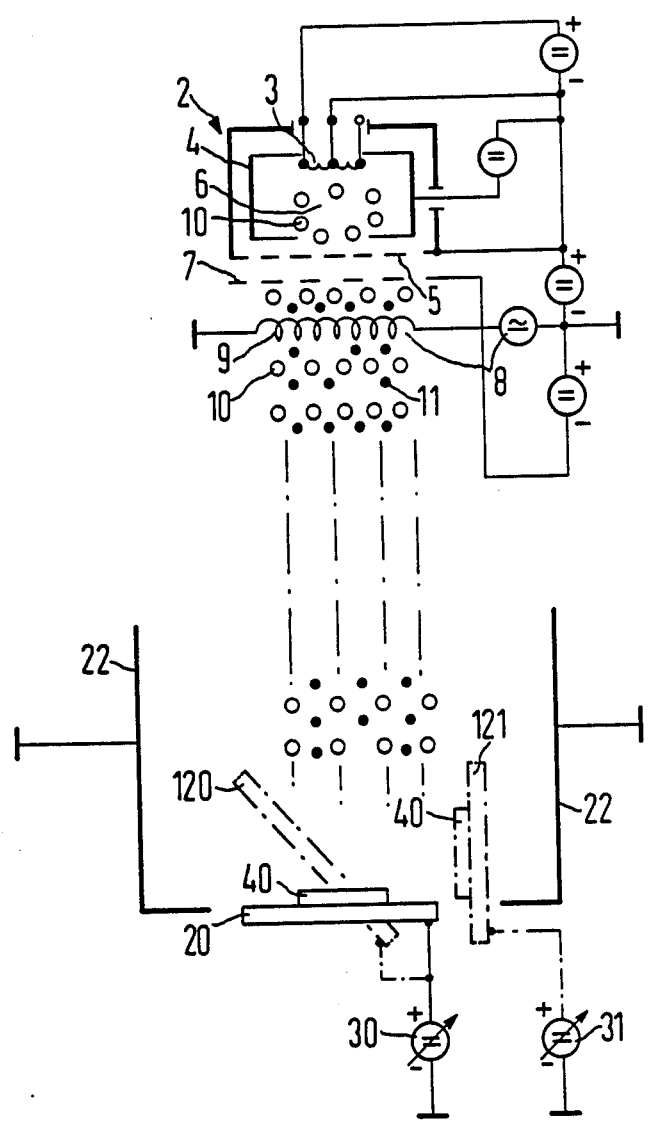

ION BEAM MATERIALS PROCESSING SYSTEM WITH NEUTRALIZATION MEANS AND METHOD

BACKGROUND OF THE INVENTION

1. Field of the Invention

The present invention relates to an ion beam neutralization device for use in an ion beam gun.

2. Description of the Prior Art

Ion beam materials processing systems are known and are used for both ion beam etching and for sputtering. In ion beam etching, an ion emission beam directly impinges the surface of a specimen on which the etching occurs, such as a semiconductor chip provided with an etching mask. In sputtering, a target is placed in the ion emission beam so that material is eroded from the target by the ion beam and the eroded material is sputtered or deposited on a specimen surface. See further R. A. Powell, "Dry Etching for Microelectronics" North Holland Physics Publishing (1984), Page 120, FIG. 5 and Page 137, FIG. 13.

In East German DD Pat. No. 14 66 25, an apparatus for coating and etching substrates is disclosed wherein the coating and etching are promoted by ion emissions. A dc voltage field aids acceleration of the ions, however, the disclosed device does not include a neutralization means. A similar device is disclosed in D. Bolenger "Ion Beam Etching with Reactive Gasses", Solid State Technology (1983), pp. 99–105, particularly FIG. 1, page 100, which includes a neutralization means in the form of a filament in the ion beam. In the disclosed device, the specimen mount lies at a voltage equal to that of the environment.

In Tsukada et al, U.S. Pat. No. 4,399,016, a plasma etching device is disclosed having high-frequency alternating current plasma, but without a neutralization means. In the Tsukada device, the specimen mounts are held at a positive potential and the surface thereof is coated with a dielectric layer. A sample to be etched is placed on the specimen mount and is, thus, insulated from the dc voltage. The specimen and specimen mount are held at the same ac potential due to the capacitance generated by the dielectric layer. Since the specimen charges negatively in the ac plasma, the positive ac potential of the specimen mount serves to hold the specimen in place by means of electrostatic attraction.

Another ion beam apparatus is disclosed in Cuomo et al, U.S. Pat. No. 4,351,712 in which a specimen is affixed to a metallic specimen mount held at environmental potential.

It is known to neutralize the space charge of an ion beam to prevent the beam from expanding by blending negatively charging electrons emitted from an electron source with the positively charged ions. Such an electron source, when used in an ion system, is known as a neutralization means.

Satisfactory operation is not generally achieved in the prior art ion beam processing systems, and particularly in extreme cases such as where a specimen and specimen mount have relatively good electrical conductivity or, respectively, where a target for use in a sputtering process exhibits relatively good electrical conductivity. The use of a neutralization means as disclosed in the prior art has also been attributed to contamination of specimens.

SUMMARY OF THE INVENTION

An object of the present invention is to provide an ion beam materials processing system and method which is free of the above-described and other disadvantages. The present invention provides a positive extraction voltage at the specimen mount, or target, differing from the environmental voltage to convey electrons from the neutralization means to the specimen mount or target. Little additional expense is required to implement the present invention and to adjust the device to obtain an optimum extraction voltage. The adjustments are also simple to make. Another advantage of the present invention is that the efficiency of the neutralization means is improved so that the neutralization means can be arranged laterally of the ion beam without modification thereof to prevent specimen contamination.

BRIEF DESCRIPTION OF THE DRAWINGS

The FIGURE is a schematic diagram of an ion beam etching system or, alternately, an ion beam sputtering system as shown in dotted outline according to the principles of the present invention.

DESCRIPTION OF THE PREFERRED EMBODIMENTS

The FIGURE shows an ion beam gun generally at 2 including a cathode 3, an anode 4 and a screen grating 5. Ion plasma 6 is generated within the interior of ion gun 2. An accelerator grating 7 accelerates ions extracted from the ion plasma 6 to form an ion ray 10. An ion beam neutralization means 8 is disposed relatively close to the accelerator grating 7, and in a preferred embodiment is spaced from the grating 7 by a distance of approximately 1 cm. The neutralization means 8 includes a filament 9 which is heated and, thus, serves as an electron source for thermally emitted electrons 11. The filament 9 is shown disposed in the center of the ion ray 10 which passes through the accelerator grating 7. The emitted electrons 11 provide a relatively good charge neutralization of the ion ray 10 to prevent the expansion of the ray 10.

The ion beam 10 is directed toward a specimen mount 20 for etching a specimen 40, or alternately toward a target 120 and a holder 121 for sputtering a specimen 40. A side wall 22 encircling the specimen mount 20, or alternately the target 120, and through which the ion beam passes, is held at ground potential. The neutralization means 8 is also held at ground potential with respect to the side wall 22, apart from the voltage drop across the filament 9. Thus, the so-called environmental potential is ground.

In one embodiment, the accelerator grating 7 is held at a potential of −250 volts, and the screen grating 5 is held to a potential of +500 volts. This causes a voltage difference of approximately 530 volts between the plasma 6 and the environmental potential.

The present invention applies an electrical extraction field between the neutralization means 8 and the target 120, or specimen mount 20, for the electrons 11 emitted by the neutralization means 8. Accordingly, a potential shifting means 30 in the form of a dc voltage source is applied to the specimen mount 20, or target 120, by connection to terminals thereon to supply a voltage which is positive in comparison to the environmental potential. The dc voltage source preferably generates a positive voltage within a range of +5 to +50 volts.

Alternately, to create a positive potential between the neutralization means 8 and the specimen mount 20, or target 120, the neutralization means 8 is held at a negative voltage in comparison to the specimen mount 20, or target 120, in which case the side walls 22 are also held to the potential of the neutralization means 8. Thus, the specimen mount 20 or target 120 is at a positive voltage with respect to the side walls 22.

For a sputtering process as shown in broken lines, the specimen mount 121 is held to the same voltage as that of the target 120. However, in another embodiment, the specimen mount 121 includes a means 31 for generating a bias voltage between the mount 121 and the target 120, resulting in a division in the electrons 11. The means 31 is selectively adjustable to create a voltage difference between the mount 121 and target 120 and thereby controllably divide the electrons encountering each.

Since an optimum neutralization of the positive ion beam 10 by the negative electrons 11 occurs when no, or very little, current flows through the voltage means 30 and 31 during their respective operation, the presence of a minimum current flow through the voltage means 30 and 31 is a useful voltage setting criterion.

In the present invention, the filament 9 of the neutralization means 8 may also be at least partially disposed to the side of the ion ray 10 without a loss of efficiency. In a preferred embodiment, the filament 9 of the neutralization means 8 is formed annularly around the ion ray 10 and is placed close to the accelerator grating 7.

Contamination is reduced by the present invention since the filament 9 need not be directly situated in the ion beam 10 without reduction of efficiency. The filament 9 is no longer heated to the same degree by the ion beam 10 since the preferred filament 9 is disposed outside the ion beam 10. Thus, a lower heating power is required for the filament 9 resulting in greater efficiency of the neutralization means 8.

The present invention is described for use with a specimen holder or target which has relatively good conductivity. However, the present invention can also be utilized in an electrically insulating specimen mount or target, and in particular, to control charging of the specimen holder 20, or target 120.

It is apparent from the foregoing specification that the invention is susceptible to being embodied with various alterations and modifications which may differ particularly from those that I have described in the preceding specification and description. It should be understood that I wish to embody within the scope of the patent granted hereon all such modifications as reasonably and properly come within the scope of my contribution to the art.

I claim:

1. In an improved ion beam material processing system having an acceleration system including an ion beam gun from which an ion beam emerges and a specimen mount toward which the ion beam is directed, the improvement comprising:
    an ion beam neutralization means for emitting electrons into said ion beam in the space between said ion beam gun and said specimen mount;
    means for applying an extraction voltage between said neutralization means and said specimen mount, said extraction voltage being of a polarity for conveying electrons from said neutralization means to said specimen mount.

2. An ion beam material processing system as claimed in claim 1, wherein said neutralization means includes a filament disposed in said ion beam.

3. An ion beam material processing system as claimed in claim 1, wherein said neutralization means is disposed outside said ion beam.

4. An ion beam material processing system as claimed in claim 3, wherein said neutralization means includes an annular filament disposed around said ion beam.

5. An ion beam material processing system as claimed in claim 1, wherein said extraction voltage is a dc voltage within the range of +5 to +50 volts, inclusive.

6. An ion beam material processing system as claimed in claim 1, wherein said applying means for an extraction voltage includes terminals for connecting a voltage source adjusted for a minimum current flow through said voltage source during operation of said processing system.

7. An ion beam material processing system as claimed in claim 1, wherein said specimen mount includes:
    a target disposed in said ion beam and being positioned to direct target material sputtered from said target out of a specimen on said specimen mount.

8. An ion beam material processing system as claimed in claim 7, further comprising:
    means for creating a voltage differential between said target and a position of said specimen mount for holding a specimen.

9. An ion beam processing system, comprising: an ion beam gun having:
    a cathode and an anode for generating an ion plasma; and
    an accelerator screen grating for accelerating ions from said ion plasma to form an ion beam;
    a neutralizing means for generating electrons to neutralize the space charge of said ion beam;
    a specimen mount on which a specimen is mountable; and
    means for connecting a dc voltage between said specimen mount and said neutralizing means to extract electrons generated by said neutralizing means toward said specimen mount.

10. An ion beam processing system as claimed in claim 9, further comprising:
    means defining an environmental potential which is negative with respect to the voltage of said specimen mount.

11. An ion beam processing system as claimed in claim 9, wherein said neutralizing means is a filament spaced approximately one centimeter from said accelerator screen grating.

12. An ion beam processing system as claimed in claim 9, wherein said specimen mount is disposed in said ion beam for etching a specimen mounted on said specimens mount.

13. An ion beam processing system as claimed in claim 9, further comprising:
    a target disposed in said ion beam and including means for connecting a voltage between said neutralization means and said target, said specimen mount being mounted to receive material sputtered from said target by said ion beam.

14. A system as claimed in claim 13, further comprising:
    means for connecting a voltage differential between said target and said specimen mount.

15. A method for neutralizing an ion beam for use in a materials processing system, having a specimen mount toward which the ion beam is directed and a neutralization means to emit electrons into the ion beam between an ion beam source and the specimen mount, comprising:

applying an extraction voltage between the neutralization means and the specimen mount to move electrons emitted by the neutralization means toward the specimen mount.

16. An ion beam material processing system as claimed in claim 1, further comprising:

a housing forming side walls about said specimen mount; and means for maintaining said housing at a voltage the same as that of said neutralization means.

17. An ion beam processing system as claimed in claim 9, further comprising:

side walls encircling said specimen mount and electrically insulated from said specimen mount, said side walls being at a voltage identical to a voltage of said neutralizing means.--

* * * * *